United States Patent [19]

Takemae

[11] Patent Number: 4,799,196
[45] Date of Patent: Jan. 17, 1989

[54] SEMICONDUCTOR MEMORY DEVICE COMPRISING DIFFERENT TYPE MEMORY CELLS

[75] Inventor: Yoshihiro Takemae, Tokyo, Japan
[73] Assignee: Fujitsu Limited, Kanagawa, Japan
[21] Appl. No.: 17,652
[22] Filed: Feb. 24, 1987

[30] Foreign Application Priority Data

Feb. 28, 1986 [JP] Japan .................................. 61-043083

[51] Int. Cl.$^4$ ............................................... G11C 7/00
[52] U.S. Cl. ..................................... 365/190; 365/149
[58] Field of Search ................. 365/149, 190, 202, 210

[56] References Cited

U.S. PATENT DOCUMENTS 4,380,803 4/1983 Tuan ................................. 365/149 X Primary Examiner—Joseph A. Popek
Attorney, Agent, or Firm—Armstrong, Nikaido, Marmelstein & Kubovcik

[57] ABSTRACT

A semiconductor memory device including a plurality of word lines and a plurality of bit lines; a plurality of memory cells connected between one of the word lines and one of the bit lines, at least one of the memory cells connected to the word lines being of a first type having an N channel type transfer gate transistor, at least one of the memory cells connected to the word lines being of a second type having a P channel type transfer gate transistor; and means for applying a selection signal to a selected word line, the selection signal having one of two opposite polarities in accordance with an access to the first type memory cells and an access to the second type memory cells.

6 Claims, 8 Drawing Sheets

SEMICONDUCTOR MEMORY DEVICE COMPRISING DIFFERENT TYPE MEMORY CELLS

BACKGROUND OF THE INVENTION

1. Field of the Invention

The present invention relates to a semiconductor memory device. Particularly, the present invention relates to a dynamic type random access memory device including a plurality of memory cells each having a transfer gate transistor and a capacitor for storing a predetermined data.

2. Description of the Related Art

The conventional semiconductor memory device is provided with a plurality of word lines, a pair of dummy word lines, and a plurality of pairs of bit lines. Each pair of bit lines is connected to a terminal of each sense amplifier and is formed as a folded type, in which, for example, each pair of bit lines is arranged in parallel. A plurality of memory cells, each having one conductivity type transfer gate transistor and a capacitor for storing a predetermined data, are each connected between one of the word lines and one of the bit lines, and each of a plurality of dummy cells is connected between one of the dummy word lines and one of the bit lines.

When reading out the data stored in predetermined memory cells connected to a predetermined word line, a row decoder and word line driver supplies a predetermined selecting potential to a selected word line, and each transfer gate transistor connected to the selected word line is turned ON, and each potential of the bit lines connected to the turned-ON transfer gate transistors is varied to a different level in accordance with the data stored in the corresponding memory cell.

Simultaneously, the potential of each of the bit lines connected to a selected dummy word line via each of the dummy cells is set to a reference potential. Thus, the potential difference between the potential of each of the bit lines connected to the selected word line and the reference potential of the bit lines connected to the selected dummy word line is read out and amplified in the corresponding sense amplifier, and the output of the corresponding sense amplifier is supplied to corresponding data buses via predetermined transistors selected by a column decoder.

However, according to the above-mentioned conventional memory device having a plurality of word lines and a plurality of pairs of bit lines each formed as the folded type, the memory cells can be arranged only at every two intersections between the word lines and the bit lines. Therefore, in such a memory device, a problem arises in that any increase in the degree of integration of the memory cells arranged in the memory device is limited.

SUMMARY OF THE INVENTION

The present invention has been created to solve the above-mentioned problem, and one object of the present invention is to increase the degree of integration of the memory cells arranged in the memory device particularly having a plurality of pairs of bit lines each formed as the folded type. Also, another object of the present invention is to reduce the power consumption in the memory device having a plurality of pairs of bit lines each formed as the folded type or the open type.

To attain the above-mentioned object, according to the present invention, there is provided a semiconductor memory device comprising a plurality of word lines and a plurality of bit lines; a plurality of memory cells each connected between one of the word lines and one of the bit lines, at least one of the memory cells connected to each of the word lines being of a first type having an N channel type transfer gate transistor, at least one of the memory cells connected to each of the word lines being of a second type having a p channel type transfer gate transistor; and device for applying a selection signal to a selected word line, the selection signal having one of two opposite polarities in accordance with an access to the first type memory cells and an access to the second type memory cells.

According to the present invention, it is possible to increase the degree of integration of the memory cells arranged in the memory device having a plurality of pairs of bit lines each formed as the folded type, by arranging one of the first type and second type memory cells at each intersection between the word lines and the bit lines. Also, according to the present invention, it is possible to reduce the power consumption in the memory device having a plurality of pairs of bit lines each formed as the folded type or the open type, as described below.

DESCRIPTION OF THE PREFERRED EMBODIMENTS

Figure 1:
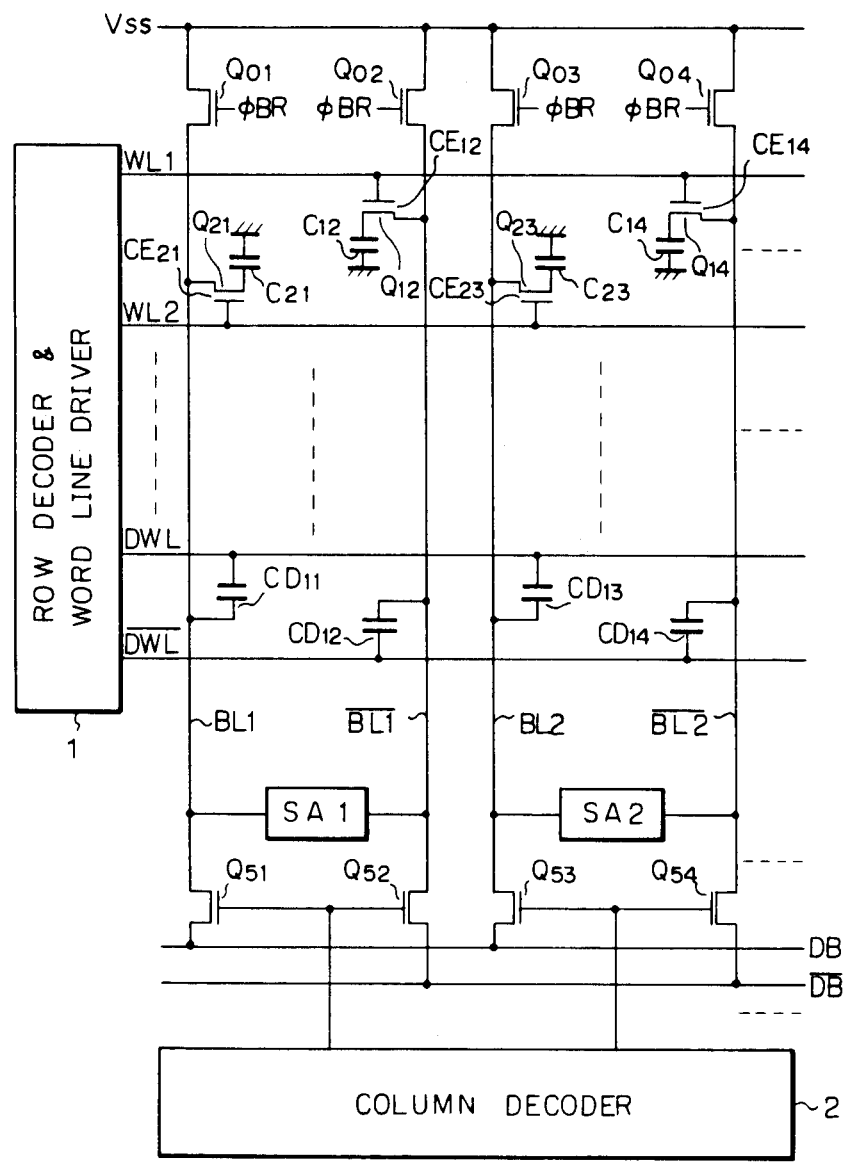
FIG. 1 is a circuit diagram showing an example of the schematic construction of a conventional semiconductor memory device having a plurality of pairs of bit lines each formed as the folded type.

In order to clarify the background of the present invention, an example of the schematic construction of a conventional semiconductor memory device comprising a plurality of memory cells each having a transfer gate transistor and a capacitor is shown in FIG. 1. In the memory device shown in FIG. 1, WL1, WL2, and so on, denote a plurality of word lines, DWL and $\overline{DWL}$ denote a pair of dummy word lines, and, BL1, $\overline{BL1}$; BL2, $\overline{BL2}$, and so on, denote a plurality of pairs of bit lines. Each of the pair of bit lines BL1 and $\overline{BL1}$ is connected between terminals of a sense amplifier SA1 and a power source line having a potential Vss via transistors Q01 and Q02 so as to form a folded type. Similarly, each of the pair of bit lines BL2 and $\overline{BL2}$ is connected between each terminal node of a sense amplifier SA2 and the power source line having a potential Vss via transistors Q03 and Q04 so as to form the folded type. A memory cell CE12 having an N channel type transfer gate transistor Q12 and a capacitor C12 is connected between the word line WL1 and the bit line $\overline{BL1}$, and a memory cell CE21 also having an N channel type transfer gate transistor Q21 and a capacitor C21 is connected between the word line WL2 and the bit line BL1. Similarly, memory cells CE14 and CE23 each having the same construction as those of the memory cells CE12 and CE21 are connected between the word line WL1 and the bit line $\overline{BL2}$ and between the word line WL2 and the bit line BL2, respectively. A dummy cell CD11 is connected between the dummy word line DWL and the bit line BL1, and a dummy cell CD12 is connected between the dummy word line $\overline{DWL}$ and the bit line $\overline{BL1}$. Similarly, each of the dummy cells CD13 and CD14 is connected between the dummy word line DWL and the bit line BL2 and between the dummy word line $\overline{DWL}$ and the bit line $\overline{BL2}$, respectively.

Reference numeral 1 shows a row decoder and word line driver which supplies a predetermined selecting potential to a selected word line (for example, WL1) and to a selected dummy word line (for example, DWL). Reference numeral 2 shows a column decoder which supplies a predetermined selecting potential to the gates of one or more pairs of transistors (for example, Q51 and Q52) each connected to a corresponding pair of selected bit lines (for example, BL1 and $\overline{BL1}$), and thus, each pair of the selected bit lines (in this case, BL1 and $\overline{BL1}$) is connected to the data buses DB and $\overline{DB}$ via each pair of selected transistors (in this case, Q51 and Q52).

The potential of each of the bit lines BL1, $\overline{BL1}$, BL2, $\overline{BL2}$, and so on, is brought to Vss level by turning ON the transistors Q01, Q02, Q03, Q04, and so on, to each of which transistors a control signal $\phi BR$ is supplied through the gate thereof. After turning OFF the transistors Q01, Q02, Q03, Q04, and so on, the read-out or write operation for predetermined memory cells is carried out.

When reading out the data stored in the predetermined memory cell for example, CE12, the transfer gate transistor Q12 having a gate to which a predetermined selecting potential is supplied via the selected word line WL1, is turned ON, and the potential of the bit line $\overline{BL1}$ is raised to a predetermined high level or is maintained at Vss level (low level) in accordance with the data stored in the memory cell CE12. Simultaneously, the potential of the bit line BL1 connected to the selected dummy word line DWL via the dummy cell CD11 is raised to a reference level corresponding to a level immediately between the above high level and low level of the bit line $\overline{BL1}$. Thus, the potential difference between the above potentials of the bit lines BL1. and BL1 is read out in the sense amplifier SA1, and is then amplified in the sense amplifier SA1, and the output of the sense amplifier SA1 is supplied to the data buses DB and $\overline{DB}$ via the selected transistors Q51 and Q52.

As above-mentioned, according to the conventional memory device having a plurality of word lines and a plurality of pairs of bit lines each formed as the folded type, the memory cells can be arranged only at every two intersections between the word lines and the bit lines. Therefore, in such a memory device, a problem arises in that an increase of the degree of integration of the memory cells arranged in the memory device is limited.

The present invention has been attained to solve the above-mentioned problem, and the feature of the present invention exists in that at least one of the first type of memory cells each having an N channel type transfer gate transistor and at least one of the second type of memory cells each having a P channel type transfer gate transistor are connected to each of the word lines so as to arrange one of the first and second type of memory cells at each intersection between the word lines and the bit lines.

Figure 2:
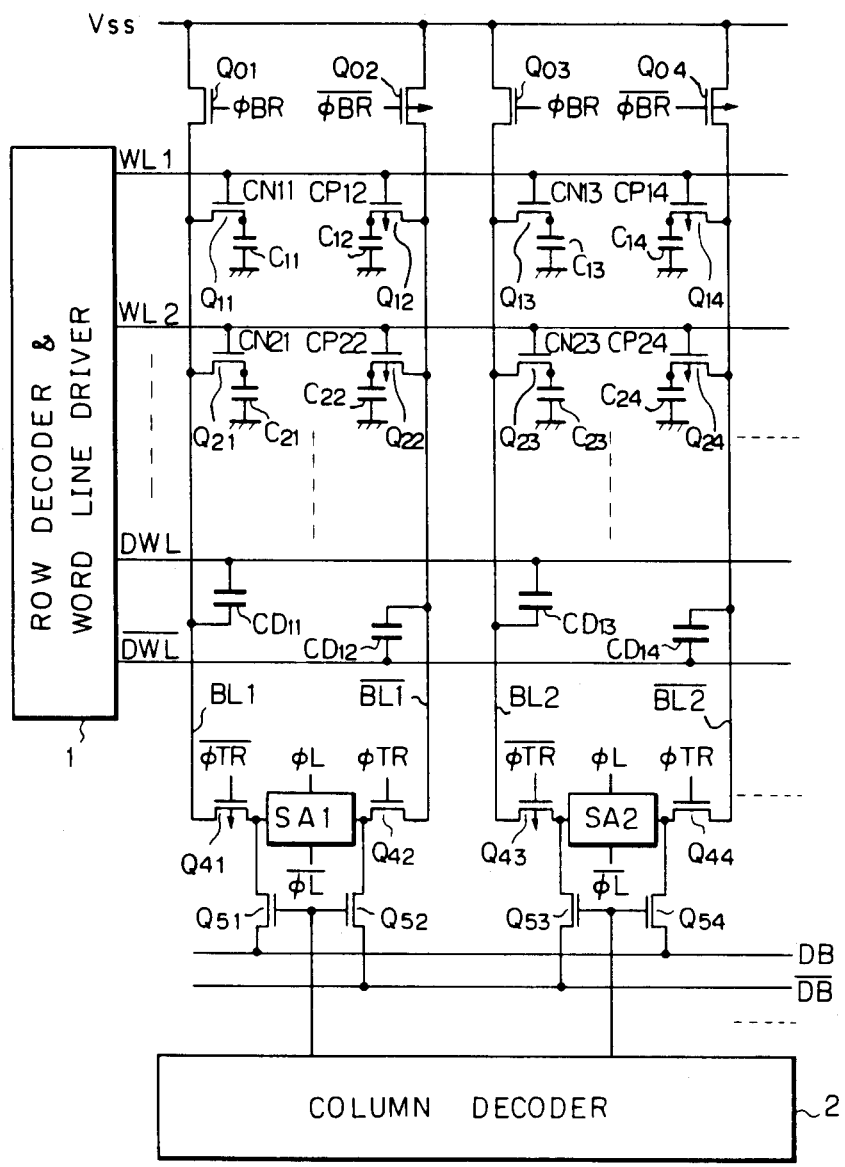
FIG. 2 is a circuit diagram showing an overall construction of the semiconductor memory device according to one embodiment of the present invention.

FIG. 2 shows an overall construction of the semiconductor memory device according to one embodiment of the present invention. The same reference numerals or characters as in FIG. 1 are given to each of the corresponding circuit portions shown in FIG. 2. As shown in FIG. 2, the memory device comprises a plurality of word lines WL1, WL2, and so on, a pair of dummy word lines DWL and $\overline{DWL}$, and a plurality of pairs of bit lines BL1, $\overline{BL1}$; BL2, $\overline{BL2}$; and so on, each formed as the folded type.

CN11, CN13, CN21, CN23, and so on, show the first type memory cells each having N channel type transfer gate transistors Q11, Q13, Q21, Q23, and so on, and capacitors C11, C13, C21, C23, and so on. References CP12, CP14, CP22, CP24, and so on, denote the second type memory cells each having P channel type transfer gate transistors Q12, Q14, Q22, Q24, and so on, and capacitors C12, C14, C22, C24, and so on.

As shown in FIG. 2, the memory cell CN11 is connected between the word line WL1 and the bit line BL1, and the memory cell CP12 is connected between the word line WL1 and the bit line $\overline{BL1}$. Also, the memory cell CN21 is connected between the word line WL2 and the bit line BL1, and the memory cell CP22 is connected between the word line WL2 and the bit line $\overline{BL1}$. Similarly, each of the memory cells CN13, CP14, CN23, and CP24 is arranged at each intersection between the word lines WL1, WL2 and the bit lines BL2, $\overline{BL2}$. Although, in the embodiment shown in FIG. 2, each of the first type memory cells (for example, CN11, CN13) connected to a predetermined word line (for example, WL1) is connected to each of the bit lines $\overline{BL1}$, $\overline{BL2}$, and so on, and each of the second type memory cells (for example, CP12, CP14) connected to the predetermined word line is connected to each of the bit lines BL1, BL2, and so on, it is also possible, for example, to connect each of the first type and the second type memory cells CN13 and CP14 to each of the bit lines $\overline{BL2}$ and BL2, respectively, without changing the connection relationship of the memory cells CN11 and CP12.

Q01 and Q03 are N channel type transistors each connected between each of the bit lines BL1 and BL2 and the power source line having the potential Vss, respectively, and the ON-OFF operation of these transistors is controlled by a control signal $\phi BR$. Also, Q02 and Q04 are P channel type transistors each connected between each of the bit lines $\overline{BL1}$ and $\overline{BL2}$ and the above power source line, respectively, and the ON-OFF operation of these transistors is controlled by a control signal $\overline{\phi BR}$. Q41 and Q43 are P channel type transistors each connected between each of the bit lines $\overline{BL1}$ and $\overline{BL2}$ and each of one terminal nodes of the sense amplifiers SA1 and SA2, respectively, and the ON-OFF operation of these transistors is controlled by a control signal $\phi TR$. Also, Q42 and Q44 are N channel type transistors each connected between each of the bit lines $\overline{BL1}$ and $\overline{BL2}$ and another terminal nodes of the sense amplifiers SA1 and SA2, respectively, and the ON-OFF operation of these transistors are controlled by a control signal $\phi TR$. $\phi L$ and $\overline{\phi L}$ are control signals for driving each of the sense amplifiers SA1, SA2, and so on.

Figure 3:
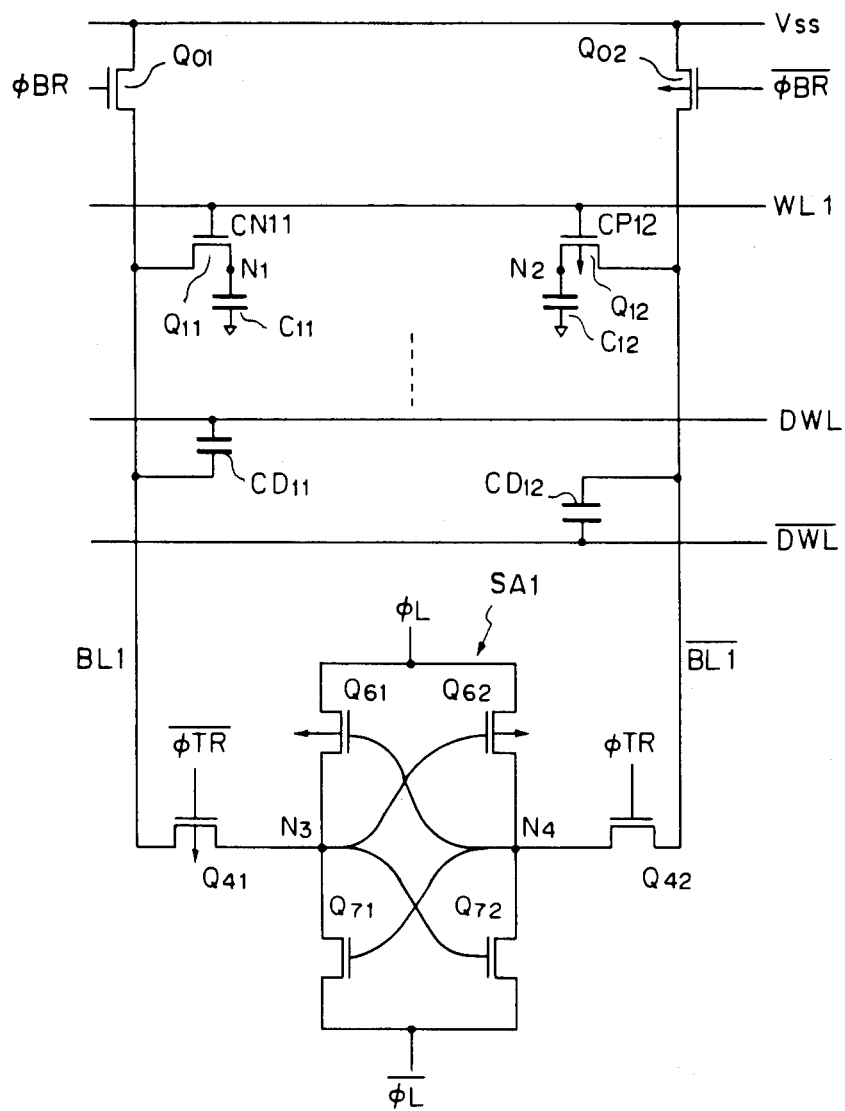
FIG. 3 is a circuit diagram showing an example of the circuit portion of a sense amplifier connected to a predetermined pair of bit lines in the memory device shown in FIG. 2.

FIG. 3 shows an example of the circuit portion of the sense amplifier connected to a predetermined pair of bit lines in the memory device shown in FIG. 2, by exemplifying the sense amplifier SA1 connected to the bit lines BL1 and $\overline{BL1}$. The operation of the circuit portion shown in FIG. 3 will be explained by exemplifying a case of a read-out operation of the data stored in a predetermined first type memory cell CN11. The sense amplifier SA1 comprises a pair of P channel type transistors Q61 and Q62 and a pair of N channel type transistors Q71 and Q72. The transistors Q61 and Q62 forms one flip-flop circuit, and the transistors Q71 and Q72 forms another flip-flop circuit.

In the reset stage, the potential of the word line (in this case, WL1) and the potentials of the control signals $\phi L$ and $\overline{\phi L}$ are set to Vss level, and each potential of the control signals $\phi BR$ and $\overline{\phi BR}$ is set to Vcc (+5 V) and −Vcc (−5 V), respectively. Thus, the transistors Q01 and Q02 are turned ON, and the potentials of the bit lines BL1 and $\overline{BL1}$ are brought to Vss level. This reset stage corresponds to the left end portion in FIG. 4 which shows a timing chart concerning the potential changes of several signals and several circuit portions in the memory circuit shown in FIG. 3.

Figure 4:
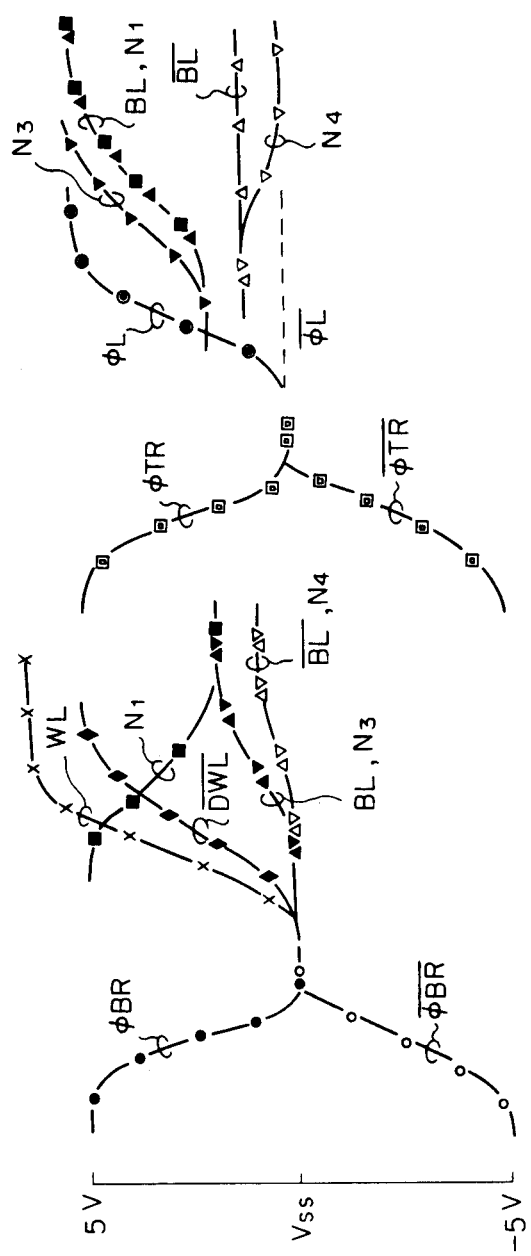
FIG. 4 is a timing chart explaining the operation of the memory circuit shown in FIG. 3.

Then, the potentials of the control signals $\phi BR$ and $\overline{\phi BR}$ each supplied to the gates of the transistors Q01 and Q02 are set to Vss level as shown in FIG. 4, thus the transistors Q01 and Q02 are cut OFF. Then, the memory device starts the read-out operation of the data stored in the predetermined memory cell (in this case CN11), and the potential of the selected word line (in this case, WL1) is gradually raised. In this connection, it is assumed that the data stored in the memory cell CN11 is "1", namely, the potential of a connection node $N_1$ between the N channel type transfer gate transistor Q11 and the capacitor C11 is high level.

When the transistor Q11 is turned ON by the raised potential of the word line WL1, the electric charges flow from the capacitor C11 to the bit line BL1 through the node $N_1$, and thus, the potential of the bit line (in this case, BL1) is raised. In this stage, the P channel type transistor Q41 is turned ON by the low potential control signal $\overline{\phi TR}$ supplied to the gate thereof, and thus the potential of one terminal node $N_3$ of the sense amplifier SA1 is raised according to the raised potential of the bit line BL1.

Simultaneously, the dummy word line $\overline{DWL}$ is selected by supplying a predetermined potential thereto, and thus the potential of the bit line $\overline{BL1}$ is raised to a reference level corresponding to the immediate level between the raised potential of the bit line BL1 and the Vss level through the dummy cell CD12, as shown in FIG. 4. As the N channel type transistor Q42 is also turned ON by the high potential control signal $\phi TR$ in this stage, the potential of another terminal node $N_4$ is also raised to the reference level of the bit line $\overline{BL1}$. Thus, the data "1" stored in the memory cell CN11 is read out in the sense amplifier SA1 as the potential difference between the potentials of the nodes $N_3$ and $N_4$, as shown in the middle portion of FIG. 4. In this connection, if the data stored in the memory cell CN11 is "0", the potentials of the bit line BL1 and the node $N_3$ are maintained at Vss level, while the potentials of the bit line $\overline{BL1}$ and the node $N_4$ are raised to the above reference level.

Subsequently, the potentials of the control signals $\phi TR$ and $\overline{\phi TR}$ are set to Vss level, and the transistors Q41 and Q42 are turned OFF. Then, the potential of the control signal $\phi L$ for the sense amplifier SA1 is set from Vss level to Vcc level, while the potential of the control $\overline{\phi L}$ is maintained at Vss level. Thus, the above potential difference between the nodes $N_3$ and $N_4$ is amplified by the flip-flop circuits formed by the transistors Q61, Q62, Q71, and Q72 arranged in the sense amplifier SA1. In this case, the P channel type transistors Q61 and the N channel type transistor Q72 are turned ON by the potentials of the nodes $N_3$ and $N_4$. In this stage, the potential of the node $N_3$ is raised to Vcc level, and simultaneously, the source potential of the transistor Q41 is raised, and thus, the transistor Q41 is turned ON again. Thus, the electric charges flow from the node $N_3$ to the node $N_1$ through the bit line BL1, and the potentials of the bit line BL1 and the node $N_1$ are also raised to Vcc level. On the other hand, the potential of the node $N_4$ is clamped to Vss level by turning ON the transistor Q72. In this stage, the transistor Q42 is turned OFF, and the potential of the bit line $\overline{BL1}$ is maintained at the reference level. The above potential relationship during the sense amplifier (in this case, SA1) operates as shown in the right portion of FIG. 4.

In this connection, if the data stored in the memory cell CN11 is "0", the potentials of the bit line BL1 and the nodes $N_1$ and $N_3$ are lowered to Vss level, while the potential of the node $N_4$ is raised to Vcc level, by turning ON the transistors Q62 and Q71. The potential of the bit line $\overline{BL1}$ is also maintained at the reference level as above-mentioned.

In the above-mentioned case, as the potential of the selected word line WL1 is raised to a predetermined high level, the N channel type transfer gate transistors (for example, Q11) provided in the first type memory cells (for example, CN11) are turned ON, while the P channel type transfer gate transistors (for example, Q12) provided in the second type memory cells (for example, CP12) are turned OFF, and thus a connection node $N_2$ between the P channel type transfer gate transistor Q12 an capacitor C12 is disconnected from the bit line $\overline{BL1}$.

Namely, when the data stored in the first type memory cells each having an N channel type transfer gate transistor are read out, a corresponding word line is selected by raising the potential thereof from Vss level to a predetermined high evel. Conversely, when the data stored in the second type memory cells each having a P channel type transfer gate transistor are read out, a corresponding word line is selected by lowering the potential thereof from Vss level to a predetermined low level so as to turn ON the P channel type transfer gate transistors.

Thus, when the data stored in the predetermined second type memory cells (for example, CP12) are read out, the potential of the selected word line WL1 is lowered to a predetermined low level, and the potential of the selected dummy word line (in this case, DWL) is also lowered to a predetermined low level, and the potential changes in the corresponding circuit portions shown in FIG. 4 are symmetrically inverted with regard to the Vss level. Namely, when the data stored in the memory cell CP12 is "1", the potential of the bit line $\overline{BL1}$ is lowered to a predetermined low level, while when the data stored in the memory cell CP12 is "0", the potential of the bit line $\overline{BL1}$ is maintained at Vss level. Also, the potential of the bit line BL1 is lowered to a reference level corresponding to the immediate level between the lowered potential of the bit line BL1 and the Vss level through the dummy cell CD11.

Thus, the data stored in the memory cell CP12 is read out in the sense amplifier SA1 as the potential difference between the potentials of the node $N_4$ corresponding to the bit line BL1 and the node $N_3$ corresponding to the bit line BL1. Then, the potential of the control signal $\phi L$ is set from Vss level to -Vcc level, while the potential of the control signal $\phi L$ is maintained at Vss level. Thus, the above potential difference between the nodes $N_4$ and $N_3$ is amplified in the sense amplifier SA1, and the potential changes in the corresponding circuit portions shown in FIG. 4 are symmetrically inverted with regard to the Vss level, as above-mentioned.

Although the above description concerns the case of the read-out operation of the memory cell data, it is also possible to perform the write operation by supplying a different potential to the selected word line in accordance with the access to the first type memory cells and the access to the second type memory cells, and by supplying predetermined write potentials to the selected bit lines. Namely, when predetermined data are written to the first type memory cells, the potential of the selected word line is raised to a predetermined high level, and when predetermined data are written to the second type memory cells, the potential of the selected word line is lowered to a predetermined low level. Thus, according to the present invention, it is possible to arrange one of the first type and second type memory cells at each intersection between the word lines and the bit lines, and thereby, to increase the degree of integration of the memory cells arranged in the memory device.

The advantages which are obtained by providing the transistors Q41 and Q42 to each terminal node of the sense amplifier SA1 will be explained below.

Generally, in the memory device having a plurality of pairs of bit lines each formed as the folded type, as each pair of bit lines BL and $\overline{BL}$ are arranged in parallel, the noise from the outside is superimposed in phase on these bit lines, and thus it is possible to prevent the disturbance of the signal corresponding to the potential difference produced between each terminal node of the sense amplifier when a predetermined word line is selected, even if the noise is superimposed on these bit lines. In this connection, according to the above embodiment of the present invention, as each of the terminal nodes $N_3$ and $N_4$ is connected to each of the bit lines BL1 and $\overline{BL1}$ before the transistors Q41 and Q42 are turned OFF, the pair of bit lines BL1 and $\overline{BL1}$ are formed as the folded type until a preand determined potential difference is produced between each terminal node of the sense amplifier when a predetermined word line is selected. However, after that, when the sense amplifier carries out the amplifying operation, the above transistors Q41 and Q42 are turned OFF, and thus, these folded type bit lines BL1 and $\overline{BL1}$ are disconnected from the sense amplifier. Further, after the sense amplifier has carried out the amplifying operation, the transistor Q41 to which the bit line BL1 connected to the selected memory cell CN11 is connected is turned ON again, as above-mentioned, and the bit line BL1 becomes a single-ended type corresponding to the open type through the transistor Q41.

As described-above, the bit lines BL1 and $\overline{BL1}$ according to the above embodiment are formed as the folded type when the potential difference produced between each terminal node of the sense amplifier is a small value such that the influence due to the noise cannot be neglected, and thus it is possible to prevent the bit lines from receiving the influence due to the noise. Further, the above bit line BL1 is formed as the open type, by disconnecting the bit line $\overline{BL1}$ from the sense amplifier after a relatively large potential difference has been produced between each terminal node of the sense amplifier, and thus it is possible to reduce the power consumption by removing the charge current and discharge current flowing through the disconnected bit line and the sense amplifier.

As above-mentioned, according to the present invention, the potential supplied to the selected word line has a different value in accordance with the access to the first type memory cells and the access to the second type memory cells. To attain this operation, it is considered, for example, to provide each of a pair of word decoders and a pair of word line drivers to each side of a memory cell array, respectively, so that one of the above decoders and drivers is driven when the potential of the selected word line is raised from Vss level, and another one of the above decoders and drivers is driven when the potential of the selected word line is lowered from Vss level.

Figure 5:
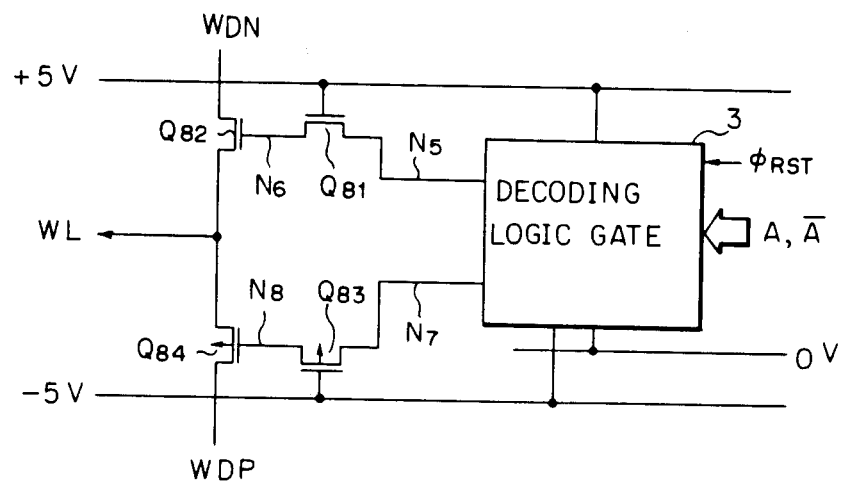
FIG. 5 is a circuit diagram showing an example of a word line driver used in the memory device according to the present invention.

FIG. 5 shows another example of the word line driver which supplies a different potential to a selected word line in accordance with the access to the first type memory cells and the access to the second type memory cells. In this example, the word line driver may be arranged at only one side of the memory cell array. As shown in FIG. 5, a plurality of row address bit signals A, a plurality of inverted row address bit signals $\overline{A}$, and a reset signal $\phi_{RST}$ are input to a decoding logic gate 3. The decoding logic gate 3 has a pair of output nodes $N_5$ and $N_7$, and each potential of the output nodes $N_5$ and $N_7$ becomes a predetermined high level and low level, respectively, in accordance with the logic level of one address bit signal. Thus, when the potential of the output node $N_5$ becomes a predetermined high level, an N channel type transistor Q82 is turned ON by supplying a predetermined high potential to the gate thereof (a node $N_6$) through an N channel type transfer gate transistor Q81. As a result, a predetermined raised potential is supplied from a clock pulse source WDN to a selected word line WL through the transistor Q82 in order to select predetermined first type memory cells. On the other hand, when the potential of the output node $N_7$ becomes a predetermined low level, a P channel type transistor Q84 is turned ON by supplying a predetermined low potential to the gate thereof (a node $N_8$) through a P channel type transfer gate transistor Q83. As a result, a predetermined lowered potential is supplied from a clock pulse source WDP to a selected word line WL through the transistor Q84 in order to select predetermined second type memory cells.

Figure 6:
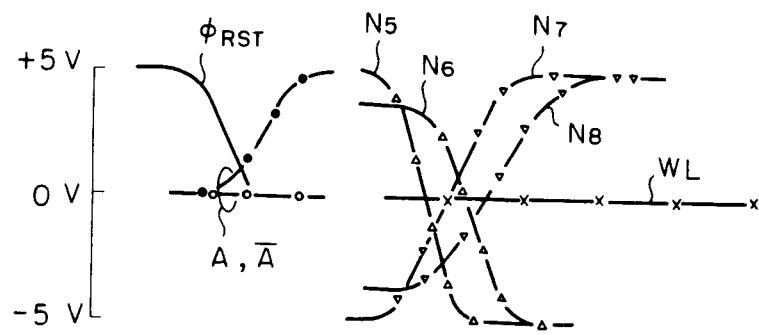
FIG. 6, FIG. 7, and FIG. 8 are timing charts explaining the operations in the different operational states of the word line driver shown in FIG. 5.

FIG. 6 is a timing chart concerning the potential changes of the reset signal $\phi_{RST}$, address bit signals A and $\overline{A}$, and the nodes $N_5$ to $N_8$ in the word line driver shown in FIG. 5 corresponding to the non-selected word line.

Figure 7:
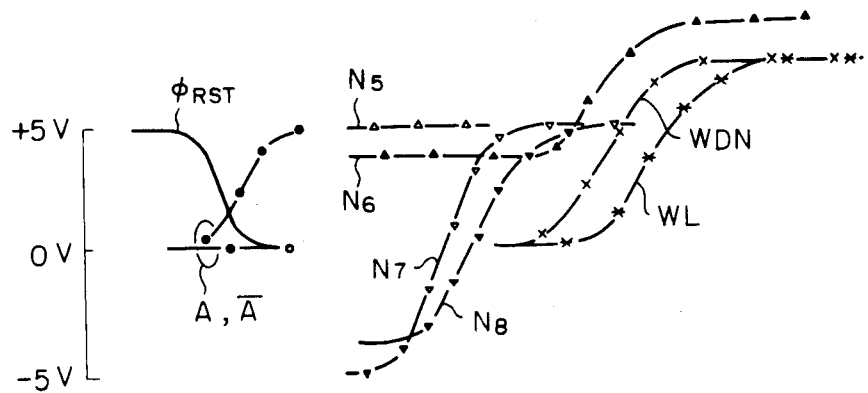
Figure 8:
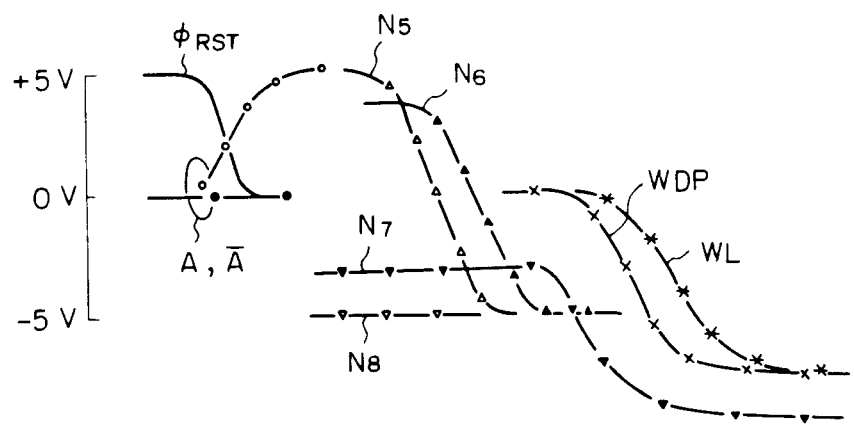

FIG. 7 is a timing chart concerning the potential changes of the same when predetermined first type memory cells are selected through the selected word line WL, and FIG. 8 is a timing chart concerning the potential changes of the same when predetermined second type memory cells are selected through the selected word line WL.

Although, in the memory device according to the above embodiment of the present invention, each pair of bit lines is formed as the folded type, it is also possible to adopt the present invention to the memory device having a plurality of pairs of bit lines formed as the open type.

Figure 9:
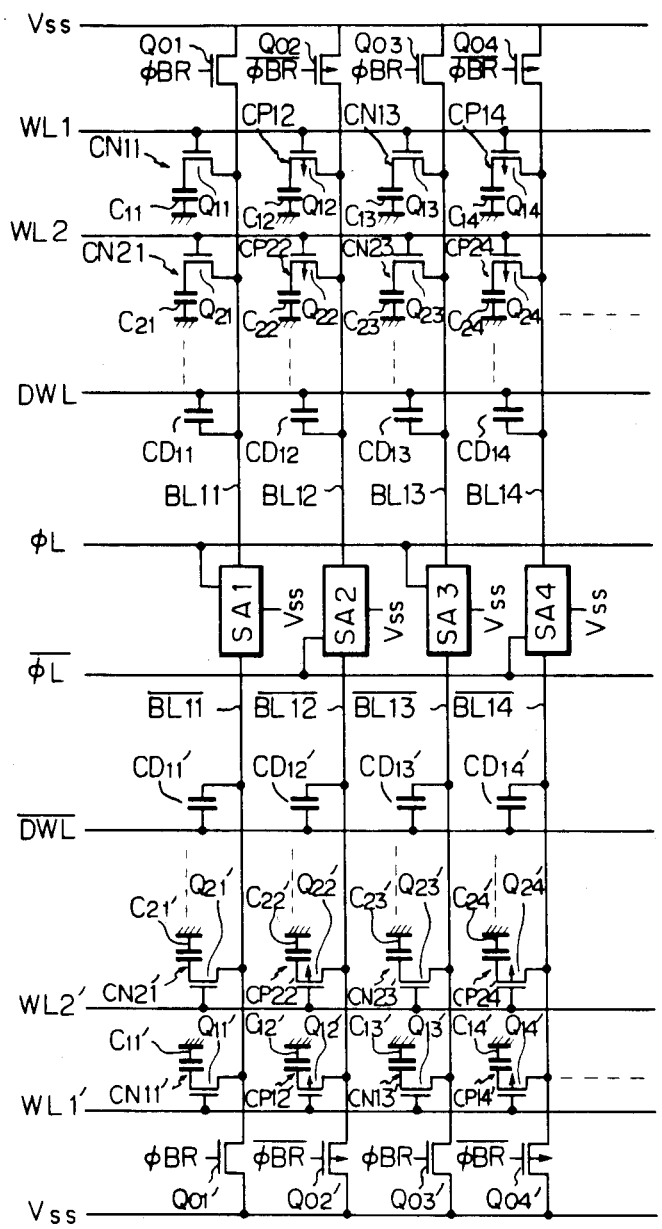
FIG. 9 is a circuit diagram showing a construction of the semiconductor memory device according to another embodiment of the present invention.

FIG. 9 shows a construction of the semiconductor memory device according to another embodiment of the present invention, which device has a plurality of pairs of bit lines BL11, $\overline{BL11}$; BL12, $\overline{BL12}$, BL13, $\overline{BL13}$, BL14, $\overline{BL14}$, and so on, formed as the open type. Each of the bit lines $\overline{BL11}$, $\overline{BL12}$, $\overline{BL13}$, $\overline{BL14}$, and so on, is connected between one terminal node of the sense amplifiers SA1, SA2, SA3, SA4, and so on, and a power source line having the potential Vss. Also, each of the bit lines BL11, BL12, BL13, BL14, and so on is connected between another terminal node of the above sense amplifiers and another power source line having the potential Vss. A plurality of word lines WL1, WL1', WL2, WL2', and so on, and a pair of dummy word lines DWL and $\overline{DWL}$ are symmetrically arranged at each side of the sense amplifiers.

Although a row decoder and word line driver and a column decoder are not shown in FIG. 9, each are connected to the word lines and the dummy word lines and to the bit lines in the same way as shown in FIG. 1.

As shown in FIG. 9, each of the first type memory cells (for example, the memory cell CN11 having an N channel type transfer gate transistor Q11 and a capacitor C11) is connected between the word lines WL1, WL1', WL2, WL2', and so on, and the bit lines BL11, $\overline{BL11}$, BL13, $\overline{BL13}$, and so on. Also, each of the second type memory cells (for example, the memory cell CP12 having a P channel type transfer gate transistor Q12 and a capacitor C12) is connected between the word lines WL1, WL1', WL2, WL2', and so on, and the bit lines $\overline{BL12}$, BL12, $\overline{BL14}$, BL14, and so on. Each of the dummy cells CD11, CD12, CD13, CD14, and so on, is connected between the dummy word line DWL and the bit lines $\overline{BL11}$, $\overline{BL12}$, $\overline{BL13}$, $\overline{BL14}$, and so on. Similarly, each of the dummy cells CD11', CD12', CD13', CD14', and so on, is connected between the dummy word line $\overline{DWL}$ and the bit lines $\overline{BL11}$, $\overline{BL12}$, $\overline{BL13}$, $\overline{BL14}$, and so on. Each of N channel type transistors Q01, Q01', Q03, Q03', and so on, is connected between the bit lines BL11, $\overline{BL11}$, BL13, $\overline{BL13}$, and so on, and the power source line, in the same way as the transistor Q01 shown in FIG. 2. Also, each of P channel type transistors Q02, Q02', Q04, Q04', and so on is connected between the bit lines BL12, $\overline{BL12}$, BL14, $\overline{BL14}$, and so on, and the power source line. The sense amplifiers SA1, SA3, and so on, are driven by the control signal $\phi L$ and the potential Vss, and the sense amplifiers SA2, SA4, and so on, are driven by the control signal $\phi L$ and the potential Vss.

When the data stored in each of the first type memory cells (for example, CN11, CN13, and so on) connected to a predetermined word line (for example, WL1) are read out, the potential of each selected word line WL1 and the dummy word line $\overline{DWL}$ is respectively raised to a predetermined value as above-mentioned, and the potential difference produced between each of the predetermined pairs of bit lines (for example, BL11, $\overline{BL11}$; BL13, $\overline{BL13}$; and so on) is read out and amplified in the sense amplifiers (for example, SA1, SA3, and so on). On the other hand, when the data stored in each of the second type memory cells (for example, CP12', CP14', and so on) connected to a predetermined word line (for example, WL1') are read out, the potential of each of the selected word line WL1' and the dummy word line DWL is respectively lowered to a predetermined value as above-mentioned, and the potential difference produced between each of the predetermined pairs of bit lines (for example, BL12, $\overline{BL12}$; BL14, $\overline{BL14}$; and so on) is read out and amplified in the sense amplifiers (for example, SA2, SA4, and so on).

Thus, according to the above embodiment, when the potential of the selected word line is raised, the first type memory cells arranged at the intersection between the selected word line (for example, WL1) and every two bit lines (for example, BL11, BL13, and so on) can be selected, nd as a result, every two sense amplifiers (for example SA1, SA3, and so on) only can operate at the same period.

Also, when the potential of the selected word line is lowered, the second type memory cells arranged at the intersection between the selected word line (for example, WL1') and every two bit lines (for example, $\overline{BL12}$, $\overline{BL14}$, and so on) can be selected, and as a result, only a part of the sense amplifiers (for example, every two sense amplifiers SA2, SA4, and so on) can operate at the same period. Therefore, according to the above embodiment, it is possible to reduce the power consumed at the same period.

Figure 10:
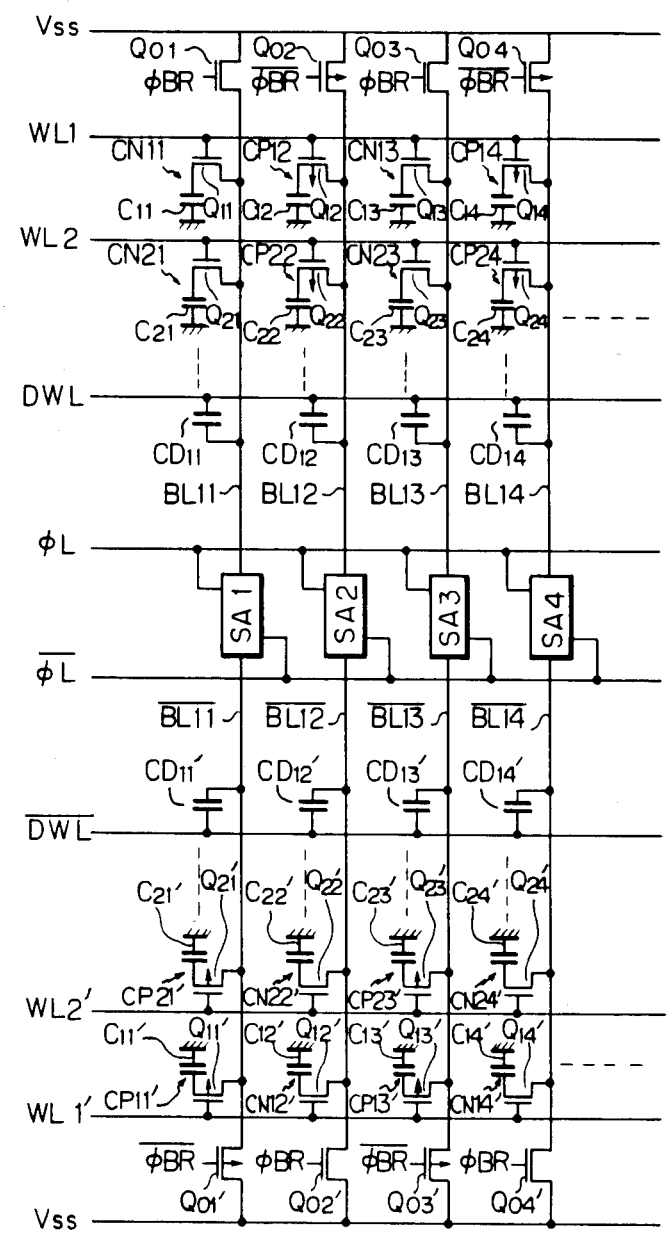
FIG. 10 is a circuit diagram showing a construction of the semiconductor memory device according to a further embodiment of the present invention.

FIG. 10 shows a construction of the semiconductor memory device according to further embodiment of the present invention, which device also has a plurality of pairs of bit lines, formed as the open type.

As shown in FIG. 10, each of the first type memory cells (for example, CN11) is connected between the word lines WL1, WL2, and so on, and the bit lines BL11, BL13, and so on, and between the word lines WL1', WL2', and so on, and the bit lines BL12, $\overline{BL14}$, and so on. Also, each of the second type memory cells (for example, CP12) is connected between the word lines WL1, WL2, and so on, and the bit lines BL12, BL14, and so on, and between the word lines WL1', WL2', and so on, and the bit lines $\overline{BL11}$, BL13, and so on. The sense amplifiers SA1, SA2, SA3, SA4, and so on, are driven by the control signals $\phi L$ and $\overline{\phi L}$ in accordance with the access to the first type memory cells and the access to the second type memory cells, in the same way as described by referring to FIG. 2 to FIG. 4.

When the data stored in each of the first type memory cells (for example, CN11, CN13, and so on) connected to a predetermined word line (for example, WL1) are read out, the potential of each of the selected word line WL1 and the dummy word line $\overline{DWL}$ is respectively raised up to a predetermined value, and the potential difference produced between each of the predetermined pairs of bit lines (for example $\overline{BL11}$, $\overline{BL11}$; BL13, $\overline{BL13}$; and so on) is read out and amplified in the sense amplifiers (for example, SA1, SA3, and so on). On the other hand, when the data stored in each of the second type memory cells (for example, CP11', CP13', and so on) connected to a predetermined word line (for example, WL1') and read out, the potential of each of the selected word line WL1' and the dummy word line DWL is respectively lowered to a predetermined value, and the potential difference produced between each of the predetermined pairs of bit lines (for example, BL11, BL11;

BL13, BL13 and so on) is read out and amplified in the sense amplifiers (for example SA1, SA3, and so on).

Thus, when the potential of the selected word line is raised, the first type memory cells arranged at the intersection between the selected word line (for example, WL1) and every two bit lines (for example, BL11, BL13, and so on) can be selected, and as a result, every two sense amplifiers (for example, SA1, SA3, and so on) only can operate at the same period.

Also, when the potential of the selected word line is lowered, the second type memory cells arranged at the intersection between the selected word line (for example WL1') and every two bit lines (for example, BL11, BL13, and so on) can be selected, and as a result, only a part of the sense amplifiers (for example, every two sense amplifiers SA1, SA3, and so on) can operate at the same period. Therefore, according to the above embodiment shown in FIG. 10, it is also possible to reduce the power consumed at the same period.

As above-mentioned, according to the present invention, it is possible to increase the degree of integration of the memory cells arranged in the memory device having a plurality of pairs of bit lines formed as the folded type, by arranging one of the first type and second type memory cells at each intersection between the word lines and the bit lines. Also, according to the present invention, it is possible to reduce the power consumption in the memory device having a plurality of pairs of bit lines formed as the folded type or the open type.

I claim:

1. A semiconductor memory device comprising:
a plurality of word lines and a plurality of bit lines;
a plurality of memory cells connected between one of said word lines and one of said bit lines, said plurality of memory cells including memory cells of a first type having an N channel type transfer gate transistor of a second type having a P channel type transfer gate transistor, each of said word lines being connected to at least one of said memory cells of said first type and at least one of said memory cells of said second type; and
applying means for applying a selection signal to a selected word line, the selection signal having one of two opposite polarities in accordance with an access to said first type memory cells and an access to said second type memory cells.

2. A semiconductor memory device according to claim 1, wherein said bit lines includes a plurality of pairs of a folded type, each one of said first type memory cells and second type memory cells connected to each of said word lines being connected to each pair of said bit lines, respectively.

3. A semiconductor memory device according to claim 1, wherein said bit lines includes a plurality of pairs of an open type, the first type memory cells being connected to one or more pairs of said bit lines, the second type memory cells being connected to remaining pairs of said bit lines.

4. A semiconductor memory device according to claim 1, wherein said bit lines includes a plurality of pairs of an open type, the first type memory cells being connected to one of each pair of said bit lines, the second type memory cells being connected to another one of each pair of said bit lines.

5. A semiconductor memory device according to claim 1, wherein each of said first type memory cells and said second type memory cells has a capacitor for storing a predetermined data.

6. A semiconductor memory device according to claim 1, wherein a potential supplied to said selected word line when the access to said first type memory cells is carried out is higher than a potential supplied when the access to said second type memory cells is carried out.

* * * * *